(12) United States Patent
Choi et al.

(10) Patent No.: US 11,192,906 B2
(45) Date of Patent: Dec. 7, 2021

(54) LEAD HALIDE ADDUCT COMPOUND AND PEROVSKITE ELEMENT USING SAME

(71) Applicants: Global Frontier Center for Multiscale Energy, Seoul (KR); Seoul National University R&DB Foundation, Seoul (KR); Research & Business Foundation Sungyunkwan University, Gyeonggi-do (KR)

(72) Inventors: Man Soo Choi, Seoul (KR); Namyoung Ahn, Seoul (KR); Nam-Gyu Park, Seoul (KR); Dae-Yong Son, Gyeonggi-do (KR); In-Hyuk Jang, Gyeonggi-do (KR); Seong Min Kang, Busan (KR)

(73) Assignees: GlobalFrontier Center for Multiscale EnergySystems, Seoul (KR); Seoul National University R&DB Foundation, Seoul (KR); Research&Business Foundation Sungkyunkwan Univ., Gyeonggi-do (KR)

( * ) Notice: Subject to any disclaimer, the term of this patent is extended or adjusted under 35 U.S.C. 154(b) by 93 days.

(21) Appl. No.: 15/745,245

(22) PCT Filed: Jun. 23, 2016

(86) PCT No.: PCT/KR2016/006675
§ 371 (c)(1),
(2) Date: Jan. 16, 2018

(87) PCT Pub. No.: WO2016/208985
PCT Pub. Date: Dec. 29, 2016

(65) Prior Publication Data
US 2018/0194786 A1    Jul. 12, 2018

(30) Foreign Application Priority Data

Jun. 25, 2015 (KR) .................. 10-2015-0090139
Sep. 11, 2015 (KR) .................. 10-2015-0129336

(51) Int. Cl.
C07F 7/24 (2006.01)
H01L 31/18 (2006.01)
(Continued)

(52) U.S. Cl.
CPC .......... *C07F 7/24* (2013.01); *H01L 31/02167* (2013.01); *H01L 31/022425* (2013.01);
(Continued)

(58) Field of Classification Search
None
See application file for complete search history.

(56) References Cited

U.S. PATENT DOCUMENTS

| 10,243,141 B2 | 3/2019 | Seok et al. |
| 2013/0139872 A1 | 6/2013 | Shum et al. |
| 2016/0322591 A1* | 11/2016 | Seok .................. C07F 7/24 |

FOREIGN PATENT DOCUMENTS

| CN | 105830228 A | | 8/2016 | |
| KR | WO2015099412 | * | 12/2014 | .......... C01G 21/006 |

(Continued)

OTHER PUBLICATIONS

Lee et al. Acc. Chem. Res. 2016, 49, 311-319.*
(Continued)

*Primary Examiner* — Clinton A Brooks
(74) *Attorney, Agent, or Firm* — Christensen Fonder Dardi; Andrew H. Auderieth; Peter S. Dardi (57) ABSTRACT

Provided is an adduct represented by Formula 1:

$$A \cdot PbY_2 \cdot Q \quad (1)$$

(Continued)

wherein A is an organic or inorganic halide, Y is F⁻, Cl⁻, Br⁻ or I⁻ as a halogen ion, and Q is a Lewis base including a functional group containing a nitrogen (N), oxygen (O) or sulfur (S) atom with an unshared pair of electrons as an electron pair donor. The Lewis base is maintained more stable in the lead halide adduct. Therefore, the use of the adduct enables the fabrication of a perovskite solar cell with high conversion efficiency.

9 Claims, 9 Drawing Sheets

(51) Int. Cl.
| | | |
|---|---|---|
| *H01L 31/0216* | (2014.01) | |
| *H01L 31/04* | (2014.01) | |
| *H01L 31/0224* | (2006.01) | |
| *H01L 51/44* | (2006.01) | |
| *H01L 51/42* | (2006.01) | |
| *H01L 51/00* | (2006.01) | |

(52) U.S. Cl.
CPC ............ *H01L 31/022475* (2013.01); *H01L 31/022483* (2013.01); *H01L 31/04* (2013.01); *H01L 31/18* (2013.01); *H01L 51/4226* (2013.01); *H01L 51/442* (2013.01); *H01L 51/0003* (2013.01); *H01L 2251/308* (2013.01); *Y02E 10/549* (2013.01)

(56) References Cited

FOREIGN PATENT DOCUMENTS

| KR | 10-2015-003871 A | 4/2015 |
|---|---|---|
| KR | 10-2015-0073821 A | 7/2015 |
| WO | 2013-171520 A1 | 11/2013 |

OTHER PUBLICATIONS

Wharf et al., Canadian Journal of Chemistry, 1976, 54 3430-3438.*
Jeon et al., "Solvent engineering for high-performance inorganic-organic hybrid perovskite solar cells", Nature Materials, DOI: 10.1038/NMAT 4014, pp. 897-903, Jul. 6, 2014.
Korean office action from corresponding Korean Application No. KR10-2015-0129336 dated Nov. 27, 2017.
Office Action from corresponding Chinese Application No. 201680037328.8 dated Dec. 12, 2019.

* cited by examiner

LEAD HALIDE ADDUCT COMPOUND AND PEROVSKITE ELEMENT USING SAME

CROSS REFERENCE TO RELATED APPLICATIONS

This application is a national stage filing of PCT application PCT/KR2016/006675 to Choi et al., entitled Lead Halide Adduct Compound and Perovoskite Element Using the Same," which claims priority to Korean patent applications 10-2015-0090139 and 10-2015-0129336, all of which are incorporated herein by reference.

BACKGROUND OF THE INVENTION

1. Field of the Invention

The present invention relates to a lead halide adduct and a perovskite device using the adduct. More specifically, the present invention relates to a perovskite light absorber that is applied to energy technologies, including solar cells, and is used in solar cells. The present invention also relates to a technique for synthesizing the perovskite light absorber and a technique for fabricating a high-performance solar cell using the perovskite light absorber.

2. Description of the Related Art

Conventional perovskite ($CH_3NH_3PbI_3$) materials for absorber layers of perovskite solar cells are formed into thin films by solution spin-coating processes, achieving high efficiency ($\geq 15\%$). Thin perovskite absorber layers formed by simple spin coating processes known in the art have low homogeneity and quality, making it difficult to fabricate solar cells with ultra-high efficiency ($\geq 19\%$). The fabrication of solar cells with ultra-high efficiency ($\geq 19\%$) requires methods for producing highly dense and crystalline perovskite absorber layers with improved homogeneity and quality.

Since the report on the 9.7% solid-state perovskite solar cell employing $MAPbI_3$ (MA=$CH_3NH_3$) and spiro-MeO-TAD, overcoming the dissolution problem of $MAPbI_3$ in liquid electrolyte, there is a surge in perovskite solar cell researches due to facile fabrication procedure and superb photovoltaic performance in both mesoscopic structure and planar structure. As a result, a power conversion efficiency (PCE) of 201.1% was certified by National Renewable Energy Laboratory (NREL).

$MAPbI_3$ layer for perovskite solar cell can be prepared using either one-step coating or sequential two-step coating. It was reported that photovoltaic performance of devices prepared by two-step coating was superior to one-step method.

Recently solvent engineering method was proposed in one-step spin coating, where DMSO was used as a co-solvent in the gamma-butyrolactone (GBL) solution containing $CH_3NH_3I$ (MAI) and $PbI_2$ (Korean Patent Publication No. 10-2015-0073821 A). One-step coated film was washed with toluene while spinning to get rid of solvent and to form a so-called intermediate phase of MAI-$PbI_2$-DMSO, by which an average PCE of about 15% together with a best PCE of 16.46% was achieved. However, the intermediate phase could not be identified by X-ray diffraction. Moreover, since toluene can wash not only GBL but also DMSO, it may be hard to induce a well-defined intermediate phase for reproducible and uniform growth of $MAPbI_3$.

On the other hand, research on the binding properties of lead halide adducts has been published in "Synthesis and vibrational spectra of some lead(II) halide adducts with O-, S-, and N-donor atom ligands (Wharf, I.; Gramstad, T.; Makihja, R.; Onyszchuk, M. Can. J. Chem. 1976, 54, 3430). This publication discloses that there may be a difference in the binding properties of lead halide adducts depending on the kind of the halogen element in the lead halide and the kinds of the sulfur-, oxygen-, and nitrogen-donor atom ligands binding to the lead halide to form the adducts, the binding properties can be predicted based on the hard and soft acid-base concept, the S-donors can more strongly bind to the lead halide than the relatively hard O-donors, and the binding intensities can be analyzed through vibrational spectra, such as Raman spectra.

SUMMARY OF THE INVENTION

The present invention is intended to propose a lead halide adduct, a perovskite thin film that is produced using the lead halide adduct and has higher quality than conventional perovskite thin films, a method for producing the perovskite thin film, and a method for fabricating an ultra-high-efficiency perovskite solar cell using the lead halide adduct.

One aspect of the present invention provides an adduct represented by Formula 1:

$$A \cdot PbY_2 \cdot Q \qquad (1)$$

wherein A is an organic or inorganic halide, Y is $F^-$, $Cl^-$, $Br^-$ or $I^-$ as a halogen ion, and Q is a Lewis base including a functional group containing a nitrogen (N), oxygen (O) or sulfur (S) atom with an unshared pair of electrons as an electron pair donor, the FT-IR peak of the functional group in the compound of Formula 1 being red-shifted by 1 to 10 $cm^{-1}$ relative to that in a compound represented by Formula 2:

$$PbY_2 \cdot Q \qquad (2)$$

wherein Y and Q are as defined in Formula 1.

The present invention also provides a method for preparing the lead halide adduct.

The present invention also provides a perovskite thin film produced using the lead halide adduct.

The present invention also provides a method for fabricating a solar cell using the lead halide adduct.

The present invention also provides a device fabricated using the lead halide adduct. Specifically, the device may be a perovskite solar cell, a perovskite photodetector or an optical device, such as an LED.

The perovskite thin film produced by removing the Lewis base from the lead halide adduct has the advantages of high homogeneity and quality. Due to these advantages, the perovskite thin film absorbs an increased amount of light and permits electrons and holes to rapidly migrate therethrough, ensuring high efficiency of the solar cell. In addition, the lead halide adduct and the method for preparing the lead halide adduct can be utilized in perovskite photodetectors and LEDs as well as perovskite solar cells.

DETAILED DESCRIPTION OF THE INVENTION

The present invention will now be described in more detail.

The present invention provides an adduct represented by Formula 1:

$$A.PbY_2.Q \quad (1)$$

wherein A is an organic or inorganic halide, Y is $F^-$, $Cl^-$, $Br^-$ or $I^-$ as a halogen ion, and Q is a Lewis base including a functional group containing a nitrogen (N), oxygen (O) or sulfur (S) atom with an unshared pair of electrons as an electron pair donor, the FT-IR peak of the functional group in the compound of Formula 1 being red-shifted by 1 to 10 $cm^{-1}$ relative to that in a compound represented by Formula 2:

$$PbY_2.Q \quad (2)$$

wherein Y and Q are as defined in Formula 1.

The present invention also provides a method for preparing the adduct.

The present invention also provides a perovskite thin film produced using the adduct.

The present invention also provides a method for fabricating a solar cell using the adduct.

The present invention also provides a device fabricated using the adduct. Specifically, the device may be a perovskite solar cell, a perovskite photodetector or an optical device, such as an LED.

According to one embodiment, A in Formula 1 may be an organic or inorganic halide in which an organic cation represented by Formula 3:

$$(R_1R_2N=CH-NR_3R_4)^+ \quad (3)$$

wherein $R_1$, $R_2$, $R_3$, and $R_4$ are independently selected from hydrogen and substituted or unsubstituted $C_1$-$C_6$ alkyl, an organic cation represented by Formula 4:

$$(R_5R_6R_7R_8N)^+ \quad (4)$$

wherein $R_5$, $R_6$, $R_7$, and $R_8$ are independently hydrogen, substituted or unsubstituted $C_1$-$C_{20}$ alkyl or substituted or unsubstituted aryl, or a $Cs^+$ cation is bonded to a halogen ion selected from $F^-$, $Cl^-$, $Br^-$, and $I^-$.

More specifically, A in Formula 1 may be selected from methylammonium iodide ($CH_3NH_3I$, MAI), formamidinium iodide ($CH(NH_2)_2I$, FAI), and CsI.

Q in Formula 1 is a Lewis base including a functional group containing a nitrogen (N), oxygen (O) or sulfur (S) atom as an electron pair donor. More specifically, Q in Formula 1 may be a Lewis base including at least one functional group selected from the group consisting of thioamide, thiocyanate, thioether, thioketone, thiol, thiophene, thiourea, thiosulfate, thioacetamide, carbonyl, aldehyde, carboxyl, ether, ester, sulfonyl, sulfo, sulfinyl, thiocyanato, pyrrolidinone, peroxy, amide, amine, imide, imine, azide, pyridine, pyrrole, nitro, nitroso, cyano, nitroxy, and isocyano groups, each of which has a nitrogen, oxygen or sulfur atom as an electron pair donor. A compound including at least one functional group selected from the group consisting of thioamide, thiocyanate, thioether, thioketone, thiol, thiophene, thiourea, thioacetamide, and thiosulfate groups, each of which has a sulfur (S) atom as an electron pair donor, is more preferred because of its ability to form a strong bond with the lead halide.

For example, Q in Formula 1 may be selected from the group consisting of dimethyl sulfoxide (DMSO), N,N-dimethylacetamide (DMA), N-methyl-2-pyrrolidinone (MPLD), N-methyl-2-pyridine (MPD), 2,6-dimethyl-γ-pyrone (DMP), acetamide, urea, thiourea (TU), N,N-dimethylthioacetamide (DMTA), thioacetamide (TAM), ethylenediamine (EN), tetramethylethylenediamine (TMEN), 2,2'-bipyridine (BIPY), 1,10-piperidine, aniline, pyrrolidine, diethylamine, N-methylpyrrolidine, n-propylamine, and combinations thereof. Preferably, Q in Formula 1 is selected from thiourea (TU), N,N-dimethylthioacetamide (DMTA), and thioacetamide (TAM), each of which includes a sulfur (S) atom as an electron pair donor.

The FT-IR peak corresponding to the functional group containing the electron pair donor atom where the Lewis base represented by Q is bonded to Pb is red-shifted by 10 to 30 $cm^{-1}$ relative to that in the compound of Formula 2.

The Lewis base may be in the form of a liquid and is preferably non-volatile or only slightly volatile. The Lewis base may have a boiling point of 120° C. or above, for example 150° C. or above.

According to the present invention, the method for preparing the lead halide adduct of Formula 1 includes: dissolving a lead halide, an organic or inorganic halide, and a Lewis base including a nitrogen (N), oxygen (O) or sulfur (S) atom as an electron pair donor in a first solvent to prepare a precursor solution; and adding a second solvent to the precursor solution and collecting the resulting precipitate by filtration.

The lead halide, the halide including a divalent cation, and the organic material including a ligand may be mixed in a molar ratio of 1:1:1-1.5, most preferably 1:1:1.

According to one embodiment, the first solvent may be a solvent that can dissolve the lead halide, the organic or inorganic halide, and the organic material including a functional group containing a nitrogen (N), oxygen (O) or sulfur (S) atom as an electron pair donor, and may be selected from the group consisting of propanediol-1,2-carbonate (PDC), ethylene carbonate (EC), diethylene glycol, propylene carbonate (PC), hexamethylphosphoric triamide (HMPA), ethyl acetate, nitrobenzene, formamide, γ-butyrolactone (GBL), benzyl alcohol, N-methyl-2-pyrrolidone (NMP), acetophenone, ethylene glycol, trifluorophosphate, benzonitrile (BN), valeronitrile (VN), acetonitrile (AN), 3-methoxypropionitrile (MPN), dimethyl sulfoxide (DMSO), dimethyl sulfate, aniline, N-methylformamide (NMF), phenol, 1,2-dichlorobenzene, tri-n-butyl phosphate, o-dichlorobenzene, selenium oxychloride, ethylene sulfate, benzenethiol, dimethylacetamide, diethylacetamide, N,N-dimethylethanamide (DMEA), 3-methoxypropionitrile (MPN), diglyme, cyclohexanol, bromobenzene, cyclohexanone, anisole, diethylformamide (DEF), dimethylformamide (DMF), 1-hexanethiol, hydrogen peroxide, bromoform, ethyl chloroacetate, 1-dodecanethiol, di-n-butyl ether, dibutyl ether, acetic anhydride, m-xylene, p-xylene, chlorobenzene, morpholine, diisopropyl ethylamine, diethyl carbonate (DEC), 1-pentanediol, n-butyl acetate, 1-hexadecanethiol, and mixtures thereof.

The first solvent may be added in an excessive amount. Preferably, the first solvent is added in such an amount that the weight ratio of the lead halide to the first solvent is 1:1-3.

According to one embodiment, the second solvent may be a nonpolar or weakly polar solvent that is capable of selectively removing the first solvent. For example, the second solvent may be selected from the group consisting of acetone-based solvents, $C_1$-$C_3$ alcohol-based solvents, ethyl acetate-based solvents, diethyl ether-based solvents, alkylene chloride-based solvents, cyclic ether-based solvents, and mixtures thereof.

According to one embodiment, the use of toluene and chlorobenzene as general volatile solvents for the preparation of the perovskite from the lead halide adduct may lead to low reproducibility because the quality of the perovskite is significantly dependent on dripping amount and/or spinning rate of washing solution and the difference in solubility between the solvent for washing and the solvent in the precursor solution. In contrast, high reproducibility of the perovskite film can be obtained using the second solvent, preferably a diethyl ether-based solvent, regardless of spin coating condition if enough amount of the second solvent is used for dissolving the first solvent completely.

Figure 1:
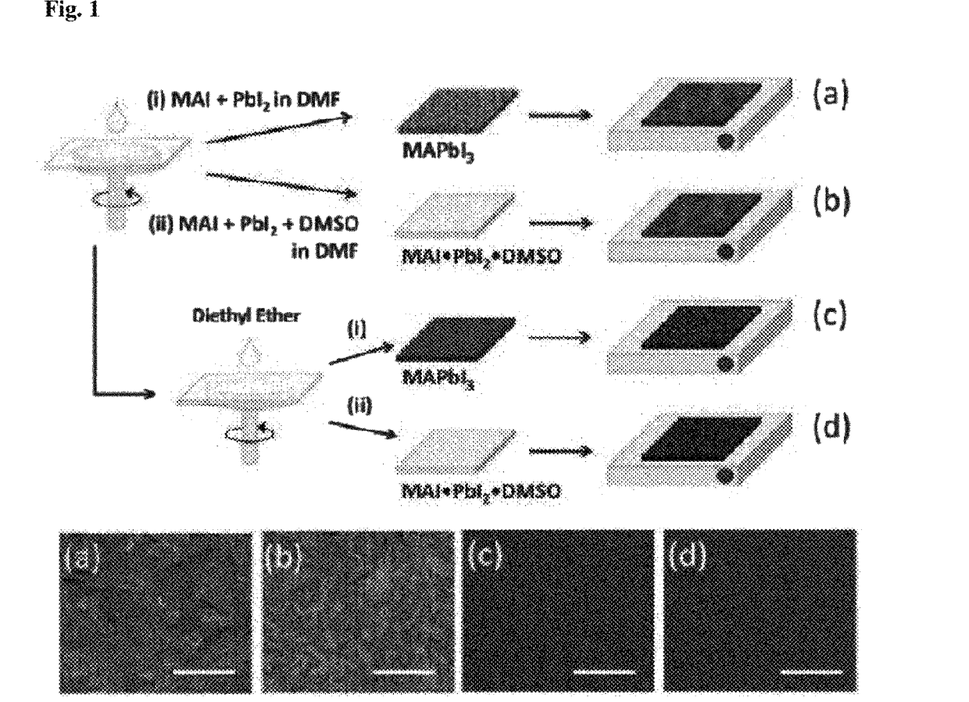
FIG. 1 shows processes for preparing lead halide adducts in Preparative Examples 1-2 and Example 2, and SEM images of films produced using lead halide adducts in (a) Comparative Example 1, (b) Comparative Example 2, (c) Comparative Example 3, and (d) Example 1.

Referring to FIG. 1, the combined use of the first and second solvents for the preparation of the lead halide adduct allows the product to have a denser structure (see (c) and (d) of FIG. 1) because the use of the volatile second solvent enables removal of the first solvent, ensuring rapid and uniform crystallization.

Figure 5:
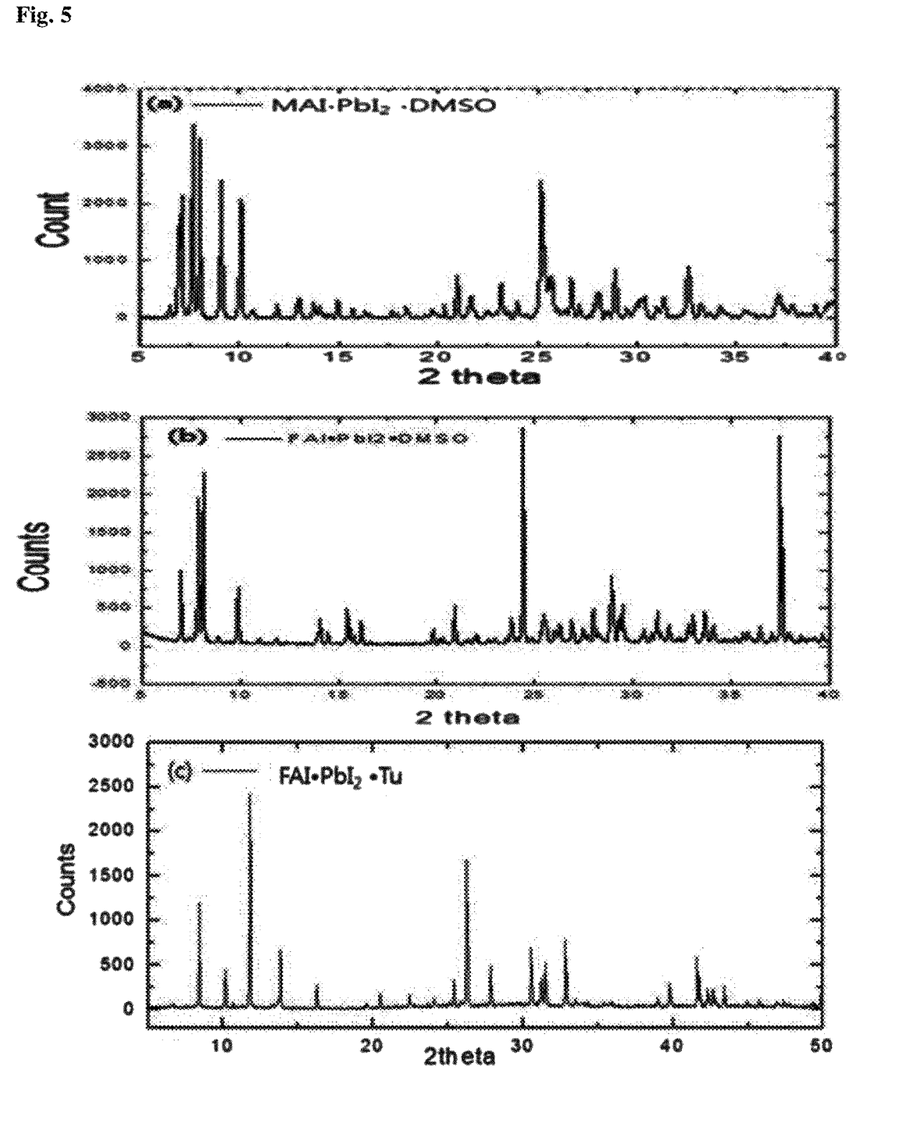
FIG. 5 shows XRD spectra of (a) $MAI.PbI_2.DMSO$ (powder), (b) $FAI.PbI_2.DMSO$ (powder), and (c) $FAI.PbI_2.TU$ prepared in Examples 2, 3, and 4, respectively.
Figure 6:
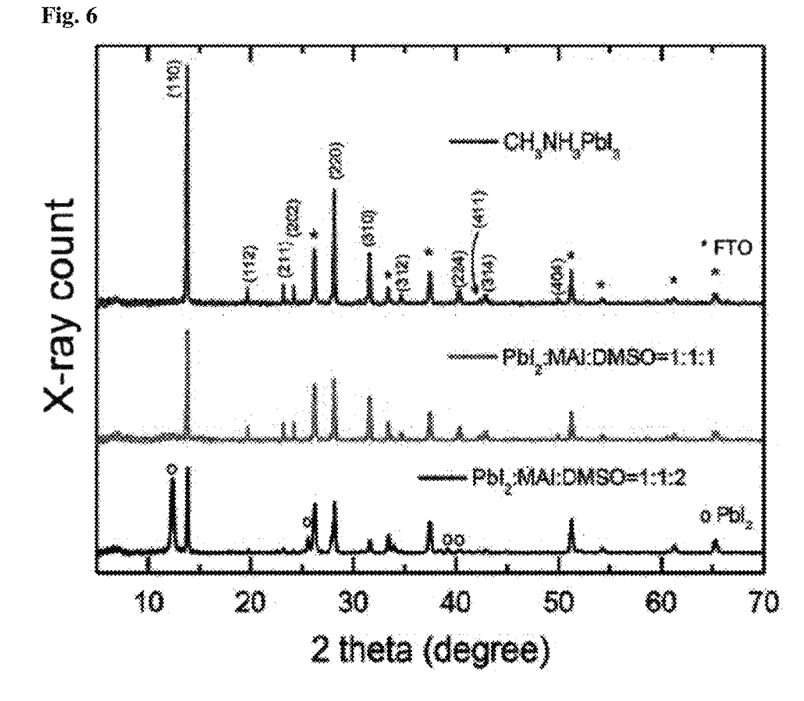
FIG. 6 shows X-ray diffraction patterns of perovskite films produced from (a) $PbI_2$:MAI:DMSO (1:1:2 mol %) and (b) $PbI_2$:MAI:DMSO (1:1:1 mol %) and (c) a standard X-ray diffraction pattern of $MAI-PbI_2$ perovskite.

According to a preferred embodiment of the present invention, the adduct may have XRD diffraction peaks at 2θ angles of 7-8.5 and 9.8-10.5 or at 2θ angles of 7.5-8.5 and 10-10.3, specifically at 2θ angles of 6-7, 7-8.5, and 9.8-10.5 or at 2θ angles of 7-8.5, 9.8-10.5, 11-12.5, and 13-14 (see FIGS. 5 and 6). These peaks are not found in compounds prepared by other methods and are characteristic to the adduct.

Figure 2:
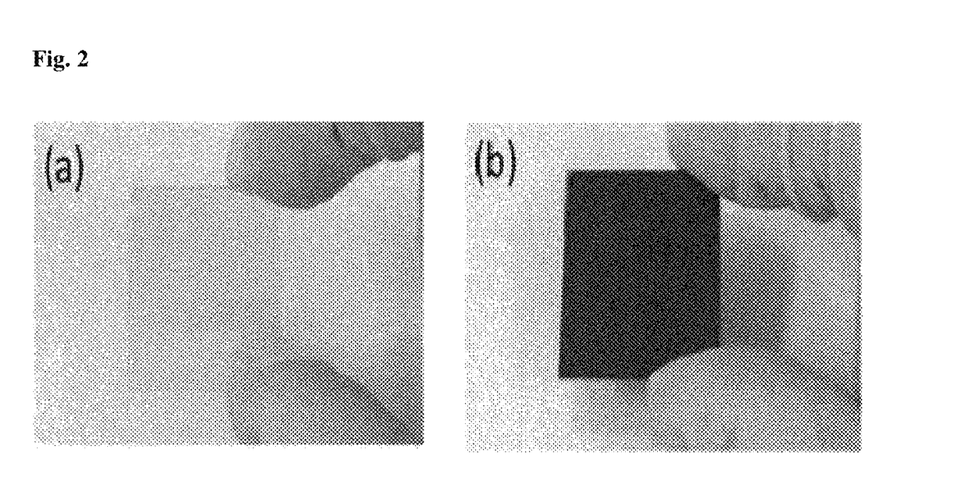
FIG. 2 shows images of a FTO substrate coated with a perovskite prepared in accordance with one embodiment of the present invention (a) before and (b) after annealing.

According to one embodiment, the lead halide adduct may form the transparent thin film shown in (a) of FIG. 2.

The lead halide adduct in the form of a thin film may be heated to a temperature of 30° C. or above, preferably 40° C. or above or 50° C. or above. For example, the lead halide adduct may be heated to the temperature range of 30° C. to 150° C. to form the desired perovskite. The heating may be performed at a temperature of 30° C. to 80° C. and subsequently at a temperature of 90° C. to 150° C. The additional heating allows the perovskite crystal to have a dense structure. The annealing process enables the removal of the organic ligand corresponding to Q in Formula 1 from the crystal structure of the lead halide adduct, leading to the formation of the perovskite. According to one embodiment, the resulting perovskite thin film may have a dark color, such as dark brown.

The perovskite solar cell thus fabricated may have a power conversion efficiency (PCE) of 17% or more, preferably 19% or more.

The perovskite thin film induced from the lead halide adduct prepared by the method has the advantages of high homogeneity and quality. Due to these advantages, the perovskite thin film absorbs an increased amount of light and permits electrons and holes to rapidly migrate therethrough, ensuring high performance and efficiency of the solar cell.

Specifically, the method for fabricating the solar cell according to the present invention includes forming a first electrode including a transparent conductive substrate, forming a blocking layer including a metal oxide on the first electrode, forming a porous layer including a porous metal oxide on the blocking layer, forming a perovskite layer on the porous layer, forming a hole transport layer on the perovskite layer, and forming a second electrode including a metal on the hole transport layer.

The lead halide adduct of the present invention is formed into a thin film on the first electrode including a transparent substrate by a spin-coating process. The transparent substrate may be made of a transparent conductive oxide. As the transparent conductive oxide, there may be used, for example, fluorine doped tin oxide (FTO), indium tin oxide (ITO), indium zinc oxide (IZO), indium zinc tin oxide (IZTO), aluminum zinc oxide (AZO), indium tin oxide-silver-indium tin oxide (ITO-Ag-ITO), indium zinc oxide-silver-indium zinc oxide (IZO-Ag-IZO), indium zinc tin oxide-silver-indium zinc tin oxide (IZTO-Ag-IZTO), aluminum zinc oxide-silver-aluminum zinc oxide (AZO-Ag-AZO), aluminum oxide ($Al_2O_3$), zinc oxide (ZnO) or magnesium oxide (MgO). Particularly, fluorine doped tin oxide (FTO) can be used.

The blocking layer formed on the transparent substrate (first electrode) is a hole blocking layer (HBL) with a deep HOMO level that blocks the migration of holes to prevent holes from recombining with electrons. The blocking layer may include at least one metal oxide selected from $TiO_2$, ZnO, $SrTiO_3$, and $WO_3$. Preferably, the blocking layer includes $TiO_2$.

The porous metal oxide of the porous layer formed on the blocking layer may be the same as the metal oxide of the blocking layer. That is, the porous layer may include at least one metal oxide selected from $TiO_2$, ZnO, $SrTiO_3$, and $WO_3$.

Any suitable material known in the art may be used without limitation to form the hole transport layer. For example, the hole transport layer may include a hole transport monomer or polymer. The hole transport monomer may be 2,2',7,7'-tetrakis(N,N-di-p-methoxyphenylamine)-9,9'-spirobifluorene (spiro-MeOTAD) and the hole transport polymer may be poly(3-hexylthiophene) ($P_3HT$). The hole transport layer may include a doping material. The doping material may be selected from the group consisting of, but not limited to, Li-based dopants, Co-based dopants, and combinations thereof. For example, the hole transport layer may be formed using a mixture of spiro-MeOTAD, 4-tert-butylpyridine (tBP), and Li-TFSI.

The second electrode may be made of at least one metal selected from the group consisting of Pt, Au, Ni, Cu, Ag, In, Ru, Pd, Rh, Ir, Os, C, and combinations thereof.

The lead halide adduct and the method for preparing the lead halide adduct according to the present invention can be utilized in perovskite photodetectors and LEDs as well as perovskite solar cells.

The method for preparing the lead halide adduct and the solar cell including the perovskite prepared by the method will be more specifically explained with reference to the following examples, including experimental examples. However, these examples are merely illustrative and should not be construed as limiting the scope of the invention.

Preparative Example 1: Preparation of $MAI.PbI_2.DMSO$ (Molar Ratio 1:1:1) Solution 461 mg of $PbI_2$, 159 mg of $CH_3NH_3I$ (MAI), and 78 mg of DMSO (molar ratio 1:1:1) were mixed in 550 mg of DMF to prepare a $CH_3NH_3I.PbI_2.DMSO$ solution.

Preparative Example 2: Preparation of $MAI.PbI_2$ (Molar Ratio 1:1) Solution 461 mg of $PbI_2$ and 159 mg of $CH_3NH_3I$ (MAI) (molar ratio 1:1) were mixed in 610 mg of DMF to prepare a $CH_3NH_3I.PbI_2$ solution.

Comparison of Surface Morphologies of Perovskite Thin Films Produced Using Different Solvents Comparative Example 1: $MAI.PbI_2$ (Molar Ratio 1:1) Solution The solution prepared in Preparative Example 2 was spin-coated on a FTO thin film to obtain a $MAPbI_3$ thin film. The thin film was heated to obtain a perovskite film.

Comparative Example 2: $MAI.PbI_2.DMSO$ (Molar Ratio 1:1:1) Solution

The solution prepared in Preparative Example 1 was spin-coated on a FTO thin film to obtain a $CH_3NH_3I.PbI_2.DMSO$ thin film. The thin film was heated to obtain a perovskite film.

Comparative Example 3: $MAI.PbI_2$ (Molar Ratio 1:1) Solution+DE

The solution prepared in Preparative Example 2 was spin-coated on a FTO thin film and diethyl ether (DE) was slowly dripped on a rotating substrate to obtain a $CH_3NH_3PbI_3$ thin film. The thin film was heated to obtain a perovskite film.

Example 1: $MAI.PbI_2.DMSO$ (Molar Ratio 1:1:1) Solution+DE

The solution prepared in Preparative Example 1 was spin-coated on a FTO thin film and diethyl ether (DE) was slowly dripped on a rotating substrate to obtain a transparent $CH_3NH_3I.PbI_2.DMSO$ adduct film. The thin film was heated to obtain a perovskite film.

The surface images of the perovskite films were obtained from a field emission scanning electron microscope (FE-SEM, Auriga, Carl Zeiss). The images are shown in FIG. 1 ((a) Comparative Example 1, (b) Comparative Example 2, (c) Comparative Example 3, and (d) Example 1).

Comparative Example 4: Preparation of $PbI_2.DMSO$ Adduct 461 mg of $PbI_2$ (99.9985%, Alpha Aesar) was dissolved in 2 ml of N,N-dimethyl sulfoxide (DMSO, 99.5%, Sigma-Aldrich) and anhydrous ethanol was added to the solution. The precipitate was filtered and dried in vacuum oven for 1 h to obtain a $PbI_2.DMSO$ powder.

Comparative Example 5: Preparation of $PbI_2.TU$ Adduct 461 mg of $PbI_2$ (99.9985%, Alpha Aesar) was dissolved in 76.1 mg of thiourea (TU, 99%, Alpha Aesar) and anhydrous ethanol was added to the solution. The precipitate was filtered and dried in vacuum oven for 1 h to obtain a $PbI_2.TU$ powder.

Example 2: Preparation of $MAI.PbI_2.DMSO$ (Molar Ratio 1:1:1) Adduct 461 mg of $PbI_2$, 159 mg of $CH_3NH_3I$ (MAI), and 78 mg of DMSO were mixed in 600 mg of N,N-dimethylformamide (DMF, 99.8%, Sigma-Aldrich). Diethyl ether was added to the solution for complete dissolution. The precipitate was filtered and dried in vacuum oven for 1 h to prepare $MAI.PbI_2.DMSO$ adduct.

Example 3: Preparation of $FAI.PbI_2.DMSO$ (Molar Ratio 1:1:1) Adduct 461 mg of $PbI_2$, 172 mg of $CH(NH_2)_2I$ (FAI), and 78 mg of DMSO were mixed in 600 mg of N,N-dimethylformamide (DMF, 99.8%, Sigma-Aldrich). Diethyl ether was added to the solution for complete dissolution. The precipitate was filtered and dried in vacuum oven for 1 h to prepare $FAI.PbI_2.DMSO$ adduct.

Example 4: Preparation of $FAI.PbI_2.Tu$ (Molar Ratio 1:1:1) Adduct 461 mg of $PbI_2$, 172 mg of $CH(NH_2)_2I$ (FAI), and 76.1 mg of thiourea (TU) were mixed in 600 mg of N,N-dimethylformamide (DMF, 99.8%, Sigma-Aldrich). Diethyl ether was added to the solution for complete dissolution. The precipitate was filtered and dried in vacuum oven for 1 h to prepare $FAI.PbI_2.TU$ adduct.

Experimental Example 1: FT-IR Spectroscopy

A Fourier transform infrared spectroscopy (FT-IR, Nicolet 6700, Thermo Scientific) was used to collect the FT-IR spectral data for liquid DMSO, powdered $PbI_2.DMSO$ (Comparative Example 4), powdered $CH_3NH_3I.PbI_2.DMSO$ (Example 2), and powdered $CH(NH_2)_2I.PbI_2.DMSO$ (Example 3) in the 4000 $cm^{-1}$-650 $cm^{-1}$ range. The KBr pellet was used for the powdered adducts.

<FT-IR: ν(S=O) Peak Analysis>

Figure 3:
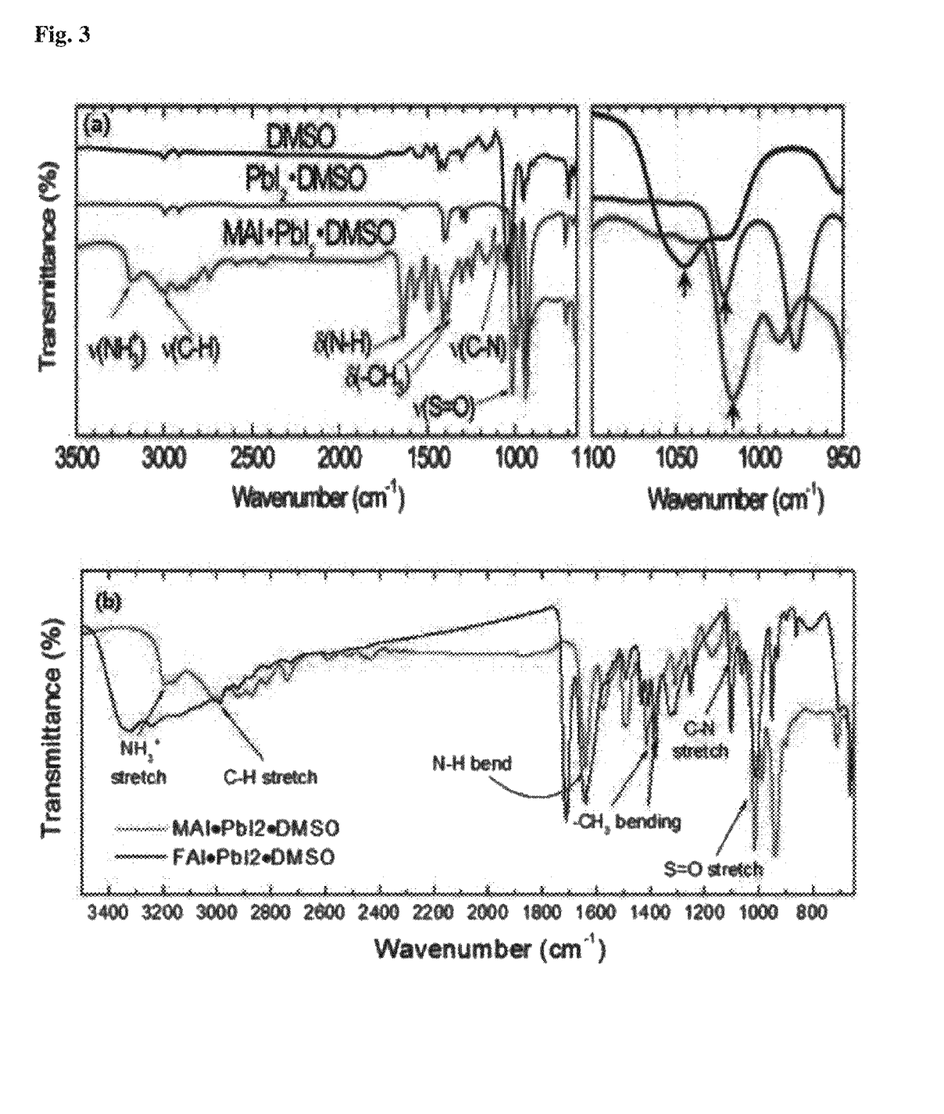
FIG. 3 shows FT-IR spectra of (a) DMSO (solution), $PbI_2.DMSO$ (powder), and $MAI.PbI_2.DMSO$ (powder), and (b) compares FT-IR spectra of $MAI.PbI_2.DMSO$ (powder) and $FAI.PbI_2.DMSO$ (powder).

The FT-IR spectra are shown in (a) of FIG. 3. The positions of the ν(S=O) peaks for the liquid DMSO and the adducts are shown in Table 1.

affecting the bonding strength of the electron pair donating functional group. This result is because the lead halide acts as a Lewis acid to form the adduct via Lewis acid-base reaction with the Lewis base. Specifically, the lead halide

TABLE 1

| | DMSO | PbI$_2$·DMSO | MAI·PbI$_2$·DMSO | FAI·PbI$_2$·DMSO |
|---|---|---|---|---|
| | O=S(CH$_3$)$_2$ | O=S(CH$_3$)$_2$ → PbI$_2$ | (MA$^+$)I$^-$ → PbI$_2$ ← O=S(CH$_3$)$_2$ | (FA$^+$)I$^-$ → PbI$_2$ ← O=S(CH$_3$)$_2$ |
| ν(S = O) | 1045 cm$^{-1}$ | 1020 cm$^{-1}$ | 1015 cm$^{-1}$ | 1010 cm$^{-1}$ |

The S=O stretching peaks of DMSO in the intermediates were observed. For the CH$_3$NH$_3$I.PbI$_2$.DMSO adduct, the peak was red-shifted because the covalent bond length between the oxygen and sulfur atoms is changed.

<Analysis of FT-IR ν(S=O) Peaks Depending on FAI and MAI Bonding>

FT-IR spectra of the adducts prepared in Examples 2 and 3 are shown in (b) of FIG. 3.

(b) of FIG. 3 reveals similar positions of the peaks corresponding to the major functional groups in the MAI.PbI$_2$.DMSO of Example 2 and the FAI.PbI$_2$.DMSO of Example 3. However, the ν(S=O) peak of the FAI-bonded adduct was red-shifted compared to that of the MAI-bonded adduct. This indicates that the covalent bond of S=O in the FAI-bonded adduct is weaker than that in the MAI-bonded adduct.

The positions of the ν(S=O) peaks in the MAI.PbI$_2$.DMSO and FAI.PbI$_2$.DMSO adducts are shown in Table 1.

<FT-IR: ν(C=S) Peak Analysis>

Figure 4:
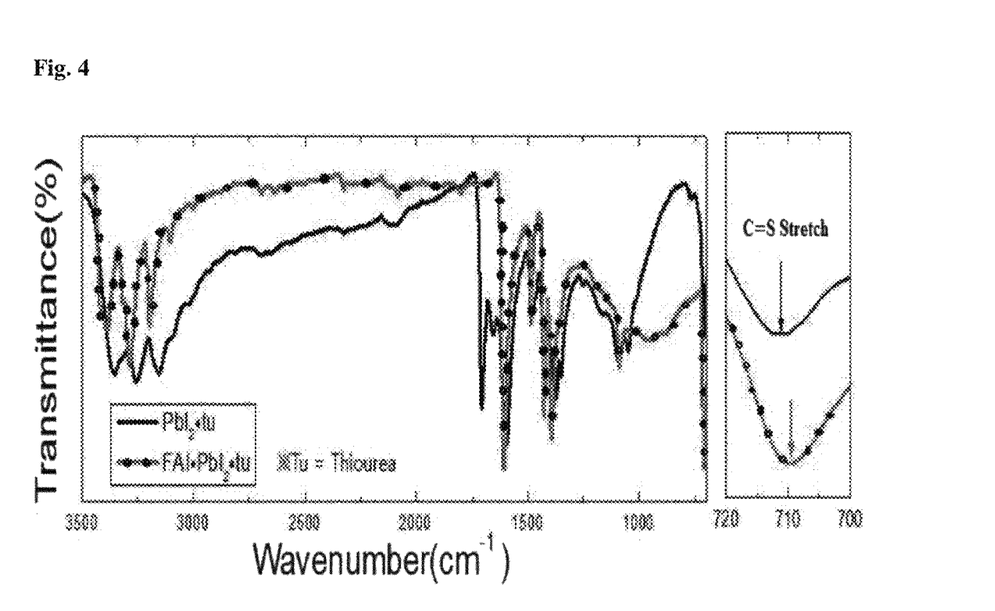
FIG. 4 shows FT-IR spectra of $PbI_2.TU$ (powder) and $FAI.PbI_2.TU$ (powder).

FT-IR spectra of the adducts of Comparative Example 5 and Example 4 are shown in FIG. 4.

FIG. 4 reveals that the ν(C=S) peak of the FAI-bonded adduct of Example 4 was red-shifted compared to the PbI$_2$.TU adduct of Comparative Example 5. The positons of the ν(C=S) peaks in the FT-IR spectra of thiourea and the PbI$_2$.TU and FAI.PbI$_2$.TU adducts are shown in Table 2 and FIG. 4.

TABLE 2

| | Thiourea (TU) | PbI$_2$ · Thiourea | FAI · PbI$_2$ · Thiourea |
|---|---|---|---|
| ν(C = S) | 728 cm$^{-1}$ | 711 cm$^{-1}$ | 709 cm$^{-1}$ |

As shown in Tables 1 and 2, red shifts were observed in the electron pair donor moieties of the Lewis bases of the inventive lead halide adducts (S=O for Examples 2 and 3 and C=S for Example 4). The peak positions of the functional groups of the Lewis bases, where the electron pair donor atoms were bonded, were red-shifted by 10-40 cm$^{-1}$. The compound of Formula 2 in which the Lewis base was bonded to the lead halide was red-shifted by about 10-30 cm$^{-1}$ relative to the bare Lewis base. The peak position of the FAI.PbI$_2$.TU was red-shifted by 1-10 cm$^{-1}$ relative to that of the compound of Formula 2. This red shift is explained by the formation of the adduct from the bonding of the Pb metal atom to the Lewis base. That is, this adduct formation weakens the bonding strength of the functional group containing the electron pair donor of the Lewis base. This leads to strong bonding of the Lewis base to Pb, and the Lewis base share the unpaired electron in the Lewis base to form a bond, which further stabilizes the phase of the lead halide adduct.

Experimental Example 2<XRD Analysis of the Adducts>

XRD spectra of the powdered adducts prepared in Examples 2-4 are shown in FIG. 5.

The results in FIG. 5 reveal that the adducts of Examples 2-4 show diffraction peaks at the following 2θ angles:
6.4°, 7.1°, 7.7°, 9.1°, and 10.1° for MAI.PbI$_2$.DMSO
6.9°, 7.8°, 8.1°, and 9.9° for FAI.PbI$_2$.DMSO
8.4°, 10.1°, 11.8°, and 13.8° for AI.PbI$_2$.TU Experimental Example 3<XRD Analysis of Perovskite Films>

Example 5: Production of Perovskite Films from MAI.PbI$_2$.DMSO (1:1:1)

461 mg of PbI$_2$, 159 mg of CH$_3$NH$_3$I, and 78 mg of DMSO (molar ratio 1:1:1) was mixed in 600 mg of DMF solution at room temperature with stirring for 1 h in order to prepare a MAI.Pbb.DMSO adduct solution. The completely dissolved solution was spin-coated on a FTO substrate and diethyl ether was slowly dripped on the rotating substrate to obtain a MAI.PbI$_2$.DMSO adduct film. The DMSO was removed from the MAI.PbI$_2$.DMSO structure by evaporation to obtain a perovskite film.

Comparative Example 6: Production of Perovskite Film from the MAI.PbI$_2$.DMSO (1:1:2)

461 mg of PbI$_2$, 159 mg of CH$_3$NH$_3$I (MAI), and 156 mg of DMSO were mixed in 600 mg of N,N-dimethylformamide (DMF, 99.8%, Sigma-Aldrich). The solution was spin-coated on a FTO substrate to form a solution layer. Diethyl ether was added to the solution layer to produce a MAI.PbI$_2$.DMSO (1:1:2) thin film. The use of diethyl ether enabled rapid removal of the DMF. The DMSO was removed from the MAI.PbI$_2$.DMSO structure by evaporation to obtain a perovskite film.

Results of X-ray diffraction analysis for the perovskite films are shown in FIG. 6.

FIG. 6 reveals that the perovskite structure produced from the MAI.PbI$_2$.DMSO (1:1:1) adduct of Example 5 had the same peaks as existing perovskite structures, indicating complete removal of the DMSO from the lead halide adduct. However, the perovskite structure of Example 5 produced by reaction with excess DMSO showed peaks other than those found in perovskite.

Experimental Example 4<UV-Vis Measurement>

Example 6: Production of Perovskite Film from MAI.PbI$_2$.DMSO (after Annealing)

461 mg of PbI$_2$, 159 mg of MAI, and 78 mg of DMSO (molar ratio 1:1:1) was mixed in 600 mg of DMF solution at room temperature with stirring for 1 h in order to prepare a MAI.PbI$_2$.DMSO adduct solution. The completely dissolved solution was spin-coated on the mp-TiO$_2$ layer at 4000 rpm for 25 sec and 0.5 ml of diethyl ether was slowly dripped on the rotating substrate in 10 sec before the surface changed to be turbid caused by rapid vaporization of DMF. The transparent MAI.PbI$_2$.DMSO adduct film was heated at 65° C. for 1 min and 100° C. for 2 min in order to obtain a dark-brown MAPbI$_3$ perovskite film.

UV-vis spectra were measured during storage at ambient conditions (relative humidity: >45%) without encapsulation and using desiccator. The results are shown in FIG. 7.

Figure 7:
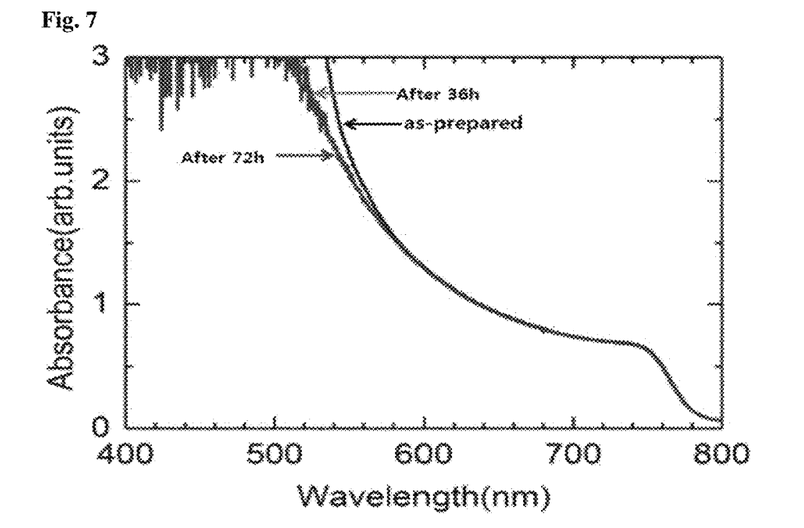
FIG. 7 shows UV-visible absorption spectra depending on aging time of a perovskite film prepared by adduct method.

The UV-vis spectra of FIG. 7 demonstrate high stability of MAPbI$_3$ obtained from the adduct at ambient conditions.

Characterization of Solar Cells

Example 7: Fabrication of Perovskite Solar Cells Using MAI.PbI$_2$.DMSO

FTO glass (Pilkington, TEC-8, 8 Ω/sq) was cleaned with detergent, diluted water, and acetone and sonicated with ethanol in an ultrasonic bath for 20 min UVO was treated for 15 min prior to use.

To prepare the TiO$_2$ blocking layer (bl-TiO$_2$), 0.15 M titanium diisopropoxide dis(acetylacetonate) (Sigma-Aldrich, 75 wt % in isopropanol) in 1-butanol (Sigma-Aldrich, 99.8%) was spin-coated on a FTO glass substrate at 700 rpm for 8 sec, 1000 rpm for 10 sec and 2000 rpm for 40 sec, which was followed by drying at 125° C. for 5 min.

Mesoporous TiO$_2$ (mp-TiO$_2$) layer was deposited on the bl-TiO$_2$ by spin-coating the TiO$_2$ colloidal solution containing 1.2 g of TiO$_2$ paste (50 nm sized nanocrystalline TiO$_2$, terpineol, ethylcellulose and lauric acid with a nominal ratio of 1.25:6:0.9:0.3 in wt %) diluted in 10 ml of anhydrous ethanol at 2000 rpm for 20 sec, which was annealed at 550° C. for 1 h and then UVO was treated for 15 min.

The substrate was further treated with 20 mM aqueous titanium tetrachloride (Sigma-Aldrich, >98%) solution at 90° C. for 10 min, cleaned with deionized water and then sintered at 500° C. for 30 min.

461 mg of PbI$_2$, 159 mg of MAI, and 78 mg of DMSO (molar ratio 1:1:1) was mixed in 600 mg of DMF solution at room temperature with stirring for 1 h in order to prepare a MAI.PbI$_2$.DMSO adduct solution. The completely dissolved solution was spin-coated on the mp-TiO$_2$ layer at 4000 rpm for 25 sec and 0.5 ml of diethyl ether was slowly dripped on the rotating substrate in 10 sec before the surface changed to be turbid caused by rapid vaporization of DMF. The resulting transparent MAI.PbI$_2$.DMSO adduct film was heated at 65° C. for 1 min and 100° C. for 2 min in order to obtain a dark-brown MAI.PbI$_2$ film.

Figure 9:
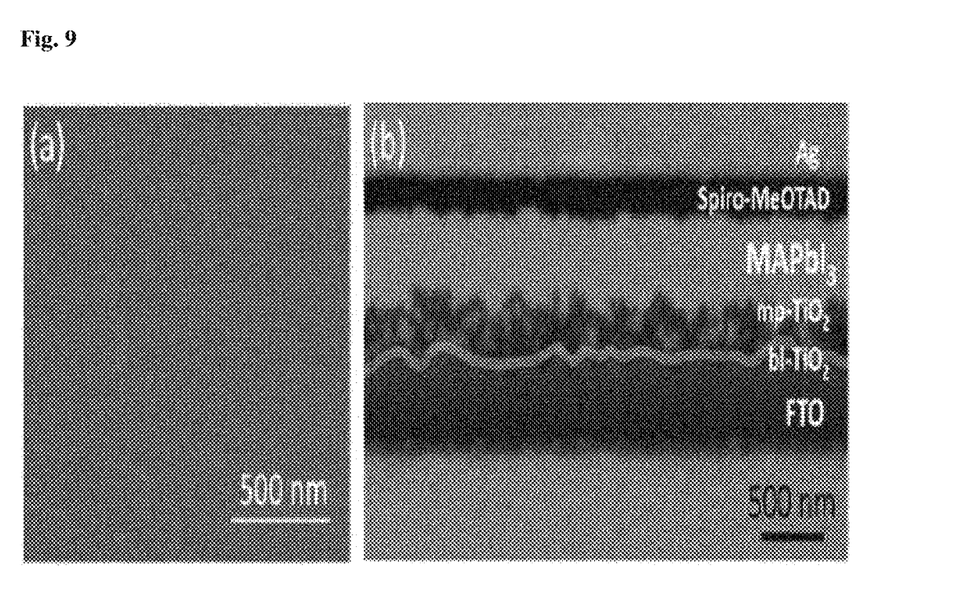
FIG. 9 shows a SEM image of lead halide adduct-induced $MAPbI_3$ and (b) a cross sectional SEM image of a solar cell including $MAPbI_3$.

The surface SEM image of the MAI.PbI$_2$ film is shown in (a) of FIG. 9. The MAI.PbI$_2$ film shows high dense nature with grains sizing from 200 to 300 nm.

20 μl of spiro-MeOTAD solution, which was consisted of 72.3 mg of spiro-MeOTAD (Merck), 28.8 μl of 4-tert-butyl pyridine and 17.5 μl of lithium bis(trifluoromethanesulfonyl)imide (Li-TFSI) solution (520 mg Li-TSFI in 1 ml acetonitrile (Sigma-Aldrich, 99.8%) in 1 ml of chlorobenzene, was spin-coated on the perovskite layer at 3000 rpm for 30 sec.

Finally, Ag electrode was deposited by using thermal evaporator at a constant evaporation rate.

(b) of FIG. 9 shows the cross-section of the fabricated solar cell. In the solar cell shown in (b) of FIG. 9, highly dense MAPbI$_3$ film with plateau surface is 400 nm thick on the 230 nm-thick mp-TiO$_2$ layer. The bl-TiO$_2$ layer and spiro-MeOTAD layer are about 40 and 190 nm, respectively.

Comparative Example 7: Fabrication of Perovskite Solar Cell from MAI.PbI$_2$ (Molar Ratio 1:1)

A perovskite solar cell was fabricated in the same manner as in Example 7, except that the intermediate without DMSO was used.

Experimental Example 5<Photo-CELIV Measurements>

To investigate mobility and charge extraction characteristics, photo-CELIV (Charge Extraction by Linearly Increasing Voltage) transients were recorded for the devices fabricated in Example 7 and Comparative Example 7 in ambient air condition. In order to collect hole only, Al$_2$O$_3$ blocking layer was used for blocking electron collection. Nd:YAG (MINILITE I, Continuum; 532 nm, 12 mJ/pulse, pulse width=3~5 ns) illuminated to FTO side of the sample.

After 3 μs delay linearly increasing voltage pulse generated by function generator (DS345, Stanford Research Systems) was applied to the samples in reverse bias (positive probe was connected to the FTO and negative probe was connected to the Ag electrode).

Offset voltage (U$_{offset}$) for suppression charge extraction by built-in electric field was −0.72 V and maximum voltage was 0.48 V for 20 μs. The results are shown in (a) of FIG. 8.

Current transient was monitored by converting voltage measured by digital oscilloscope (TDS3054B, Tektronix) using a 50Ω load resistor.

Charge carrier mobility (μ) was calculated according to Equation (1), $$\mu = \frac{2d^2}{3At_{max}^2\left[1 + 0.36\frac{\Delta j}{j_0}\right]} \text{ if } \Delta j \leq j_0 \quad (1)$$

where d is the film thickness, A is the voltage increase rate, t$_{max}$ is the time at maximum Δj of the extraction peak and j$_0$ is the capacitive displacement current. Data obtained from the above parameters are shown in Table 3.

TABLE 3

| | Film thickness (nm) | $U_{offset}$ (V) | $U_{max}$ (V) | $T_{pulse}$ (µs) | A (V/s) | $T_{max}$ (µs) | $j_0$ (mA/cm²) | $j_{max}$ (mA/cm²) | $\Delta j$ (mA/cm²) | µ (cm²/Vs) |
|---|---|---|---|---|---|---|---|---|---|---|
| Example 7 | 650 | −0.72 | 0.48 | 20 | 60000 | 3.40 | 10.90 | 12.24 | 1.34 | 3.89 × 10⁻³ |
| Comparative Example 7 | 500 | −0.72 | 0.48 | 20 | 60000 | 3.14 | 14.14 | 15.73 | 1.59 | 2.71 × 10⁻³ |

To investigate amount of extracted charges, $\Delta j$ was normalized by $j_0$. $\Delta j/j_0$ data were fitted by polynomial curve fitting. The results are shown in (b) of FIG. 8.

Figure 8:
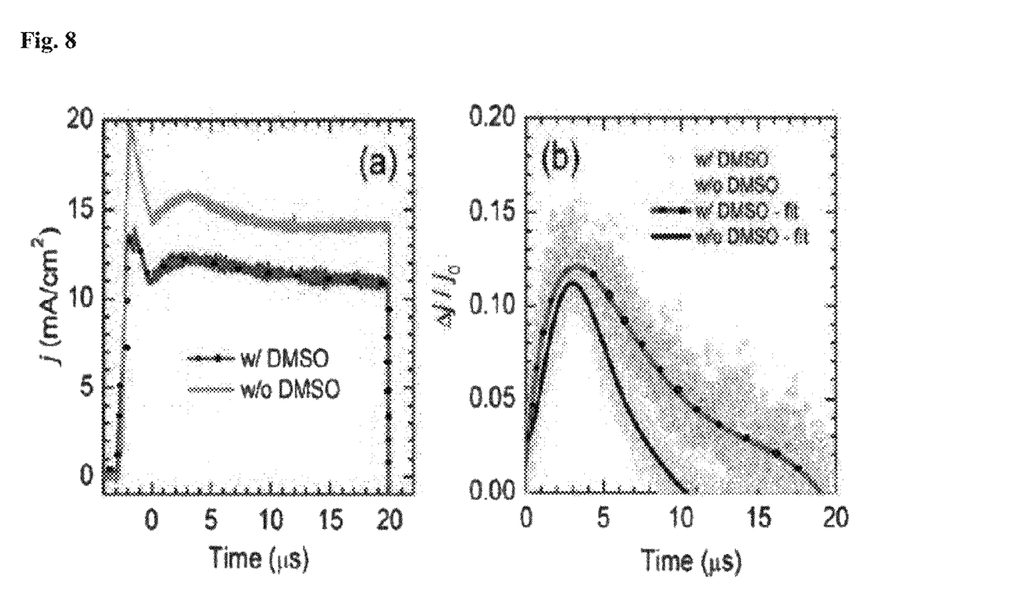
FIG. 8 shows (a) photo-CELIV current transients of a solar cell including $MAPbI_3$ prepared using DMF or DMSO/DMF as solvents and (b) changes in current with time.

The charge carrier transport property of the MAPbI$_3$ prepared via adduct is studied by photoinduced charge extraction by linearly increasing voltage in the solar cells fabricated in Example 7 and Comparative Example 7. FIG. 8 shows the current transient of photo-CELIV for the cell fabricated in Example 7, which is compared with the cell fabricated in Comparative Example 7. Charge carrier mobility is calculated from the current (j)–time (t) curve in (a) of FIG. 8. A charge extraction CELIV peak appears at 3 µs after applying triangular increasing voltage ramp, and then current is saturated to the displacement current of the capacitance ($j_0$).

The difference in current density arises from difference in film thickness of 650 nm for the MAI.PbI$_2$.DMSO adduct-induced MAPbI$_3$ and 500 nm for the MAPbI$_3$ without DMSO because $j_0$ is defined as $j_0 = \varepsilon \varepsilon_0 A/d$ ($\varepsilon$, dielectric constant; $\varepsilon_0$, vacuum permittivity; A, voltage increase rate; d, film thickness). The difference in film thickness is attributed to change in viscosity by DMSO, which affect $j_0$ and entire current density.

The charge carrier mobility is calculated by Equation 1 with the current density at maximum peak ($\Delta j$) and $t_{max}$ that is the time when the current density is maximized.

The parameters of Equation 1 and the calculated charge carrier mobilities are shown in Table 3.

The charge carrier mobility of the cell of Example 7 was significantly higher than that of the solar cell including the perovskite grown in the known MACl-assisted one-step solution.

In (b) of FIG. 8, $\Delta j$ is normalized by $j_0$ to compare charge extraction behavior. Extracted charge is proportional to the area of the curve. Extracted charges of the cell of Example 7 are greater than those of the cell of Comparative Example 7. The extent of the extracted charges can explain charge recombination. Photoexcited electrons and holes will be extracted by built-in electric field or recombined in the absence of external electric field. Since photo-CELIV is designed to extract charges not by built-in electric field, the extracted charges in (b) of FIG. 8 result from the charges that are not recombined. Therefore, the more extracted charges in the MAI.PbI$_2$.DMSO adduct-induced MAPbI$_3$ is indicative of slow recombination.

Figure 10:
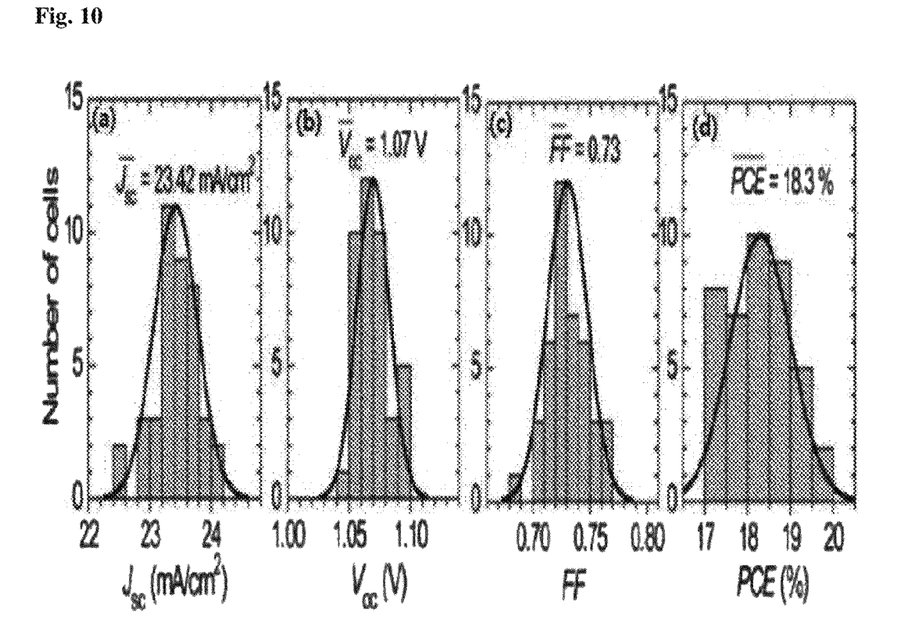
FIG. 10 shows histograms of (a) short-circuit density ($J_{sc}$), (b) open-circuit voltage ($V_{oc}$), (c) fill factor (FF), and (d) power conversion efficiency (PCE) of 41 solar cells fabricated by a method described in Example 7.

41 solar cell samples were fabricated by the method described in Example 7. FIG. 10 shows histograms of (a) short-circuit current density ($J_{sc}$), (b) open-circuit voltage ($V_{oc}$), (c) fill factor (FF), and (d) power conversion efficiency (PCE) of the 41 solar cell samples. The $J_{sc}$, $V_{oc}$, FF, and PCE values of the 41 cells are described in Table 4.

TABLE 4

| Device # | $J_{sc}$ (mA/cm²) | $V_{oc}$ (V) | FF | PCE (%) |
|---|---|---|---|---|
| 1 | 23.18 | 1.093 | 0.721 | 18.28 |
| 2 | 23.70 | 1.097 | 0.730 | 18.98 |
| 3 | 23.66 | 1.086 | 0.735 | 18.89 |
| 4 | 23.43 | 1.092 | 0.727 | 18.60 |
| 5 | 23.34 | 1.097 | 0.735 | 18.82 |
| 6 | 24.14 | 1.090 | 0.728 | 19.18 |
| 7 | 23.65 | 1.074 | 0.723 | 18.37 |
| 8 | 23.52 | 1.077 | 0.732 | 18.55 |
| 9 | 24.03 | 1.047 | 0.679 | 17.08 |
| 10 | 23.47 | 1.051 | 0.717 | 17.69 |
| 11 | 23.18 | 1.051 | 0.724 | 17.64 |
| 12 | 22.45 | 1.064 | 0.718 | 17.16 |
| 13 | 22.98 | 1.061 | 0.714 | 17.41 |
| 14 | 22.95 | 1.060 | 0.713 | 17.35 |
| 15 | 23.80 | 1.065 | 0.723 | 18.32 |
| 16 | 23.63 | 1.072 | 0.745 | 18.88 |
| 17 | 23.48 | 1.071 | 0.726 | 18.28 |
| 18 | 23.53 | 1.054 | 0.732 | 18.15 |
| 19 | 23.56 | 1.061 | 0.732 | 18.30 |
| 20 | 22.49 | 1.059 | 0.744 | 17.73 |
| 21 | 23.67 | 1.070 | 0.683 | 17.30 |
| 22 | 23.35 | 1.068 | 0.700 | 17.45 |
| 23 | 23.22 | 1.078 | 0.755 | 18.91 |
| 24 | 23.25 | 1.059 | 0.745 | 18.34 |
| 25 | 23.69 | 1.057 | 0.723 | 18.10 |
| 26 | 23.21 | 1.065 | 0.724 | 17.9 |
| 27 | 23.18 | 1.067 | 0.727 | 17.99 |
| 28 | 22.88 | 1.058 | 0.718 | 17.40 |
| 29 | 23.57 | 1.064 | 0.730 | 18.31 |
| 30 | 23.53 | 1.067 | 0.716 | 17.99 |
| 31 | 23.41 | 1.069 | 0.727 | 18.19 |
| 32 | 23.33 | 1.073 | 0.743 | 18.60 |
| 33 | 23.36 | 1.078 | 0.758 | 19.09 |
| 34 | 24.08 | 1.077 | 0.744 | 19.30 |
| 35 | 23.83 | 1.079 | 0.750 | 19.29 |
| 36 | 23.83 | 1.086 | 0.762 | 19.71 |
| 37 | 23.32 | 1.068 | 0.763 | 19.01 |
| 38 | 23.83 | 1.086 | 0.762 | 19.71 |
| 39 | 23.73 | 1.064 | 0.747 | 18.87 |
| 40 | 23.24 | 1.056 | 0.704 | 17.29 |
| 41 | 23.29 | 1.050 | 0.727 | 17.79 |
| Standard deviation | 0.367 | 0.013 | 0.019 | 0.708 |

As can be seen in (a)-(d) of FIG. 10 and Table 4, the adduct-induced MAPbI$_3$ exhibits photovoltaic parameters with small standard deviation, leading to average short-circuit photocurrent density ($J_{sc}$) of 23.44±0.37 mA/cm², open-circuit voltage ($V_{oc}$) of 1.070±0.013 V, fill factor (FF) of 0.729±0.019, and power conversion efficiency (PCE) of 18.30±0.71%.

Figure 11:
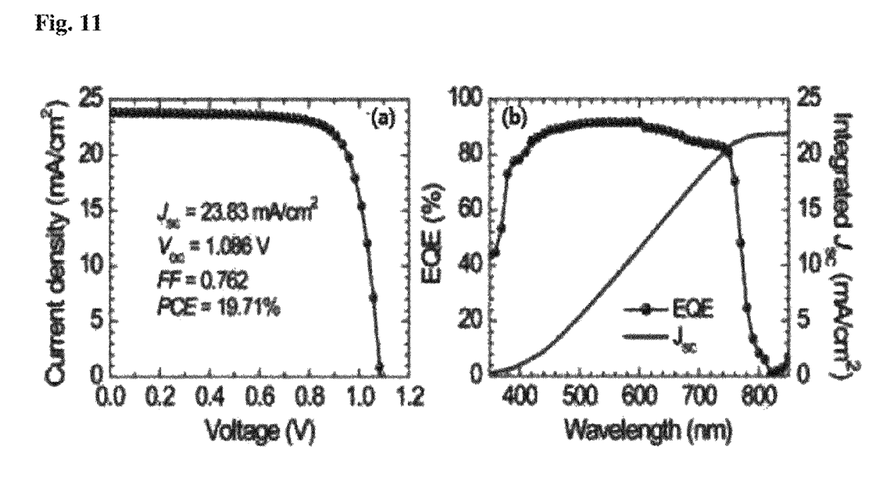
FIG. 11 shows (a) a J-V curve and (b) an external quantum efficiency (EQE) spectrum together with EQE data-based integrated $J_{sc}$ for the best performing perovskite solar cell.

FIG. 11 shows (a) a J-V curve and (b) an external quantum efficiency (EQE) spectrum together with EQE data-based integrated $J_{sc}$ for the best performing perovskite solar cell. J-V data in (a) of FIG. 11 were collected at reverse scan under AM 1.5 G one sun illumination (100 mW/cm²). The aperture mask area was 0.125 cm². The data were collected with the 16 h-aged cells because Ag electrode-based device showed normally poor fill factor right after fabrication.

The measured $J_{sc}$ is well consistent with the integrated $J_{sc}$ of 22 mA/cm² estimated from incident-photon to current conversion efficiency (IPCE) in (b) of FIG. 11. It is noted that maximum IPCE reaches over 91%, which is mainly due to high charge extraction property of the adduct-induced MAPbI$_3$ and in part due to light reflection by the back Ag electrode.

Figure 12:
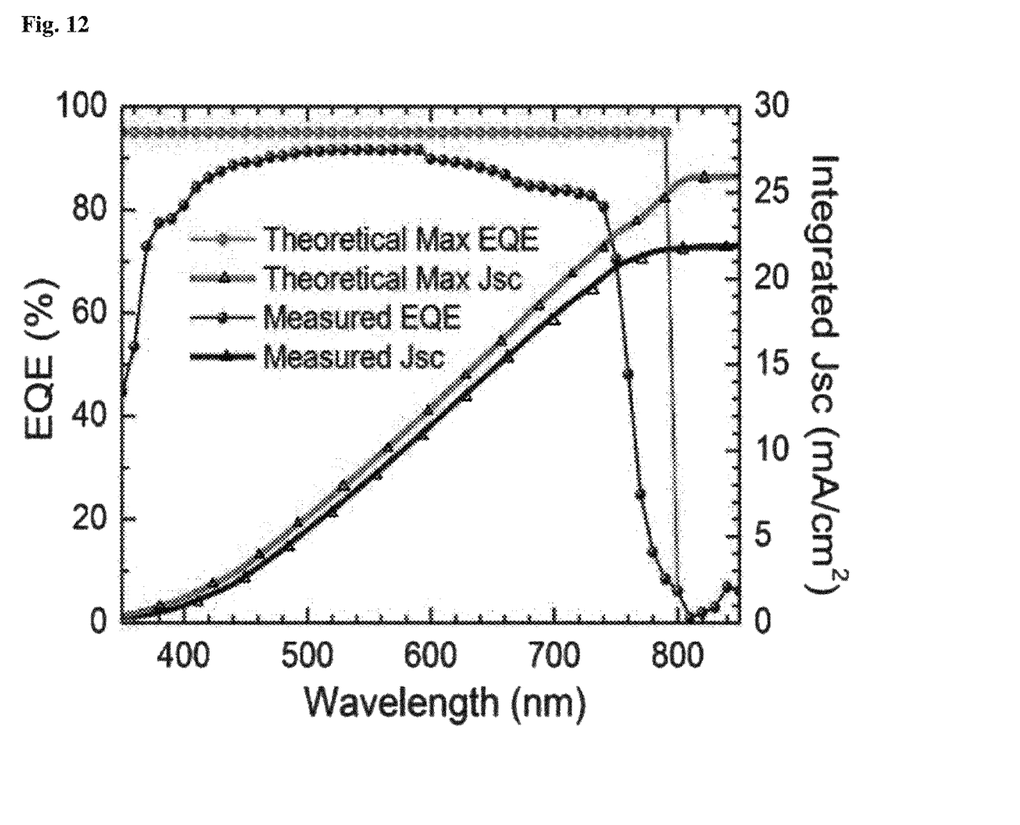
FIG. 12 shows theoretically maximum short-circuit current density as a function of wavelength calculated by assuming 100% internal quantum efficiency and 5% optical loss from FTO glass and measured data.

FIG. 12 shows theoretically maximum short-circuit current density and EQE as a function of wavelength calculated by assuming 100% internal quantum efficiency and 5% optical loss from the FTO glass and actually measured maximum short-circuit current density and EQE. As can be seen from the results in FIG. 12, the measured data did not exceed the theoretical maximum.

Figure 13:
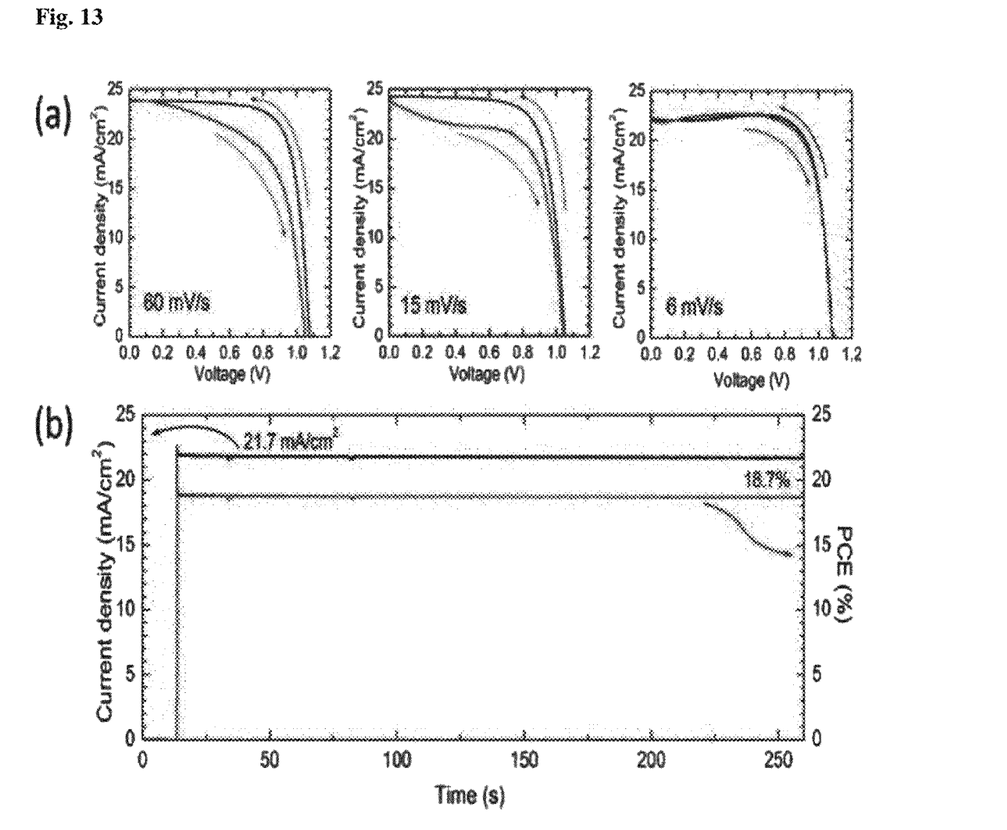
FIG. 13 shows (a) J-V curves measured depending on scan direction and scan rate and (b) stabilized photocurrent density and power conversion efficiency measured at maximum power voltage of 0.86V for 250 seconds.

(a) of FIG. 13 shows J-V curves measured depending on scan direction and scan rate. The related J$_{sc}$ (mA/cm$^2$), V$_{cc}$ (V), FF, and PCE (%) values are shown in Table 4. In (b) of FIG. 13, J-V hysteresis is checked and little hysteresis is found at slow scan rate, where PCE=18.62% at reverse scan and 18.18% at forward scan showing 2% difference. The stabilized PCE is demonstrated by holding the voltage at the maximum power point at a slow scan.

TABLE 5

| Scan rate | Scan direction | J$_{sc}$ (mA/cm$^2$) | V$_{oc}$ (V) | FF | PCE (%) |
|---|---|---|---|---|---|
| 60 mV/s | Reverse | 23.83 | 1.076 | 0.750 | 19.21 |
| | Forward | 23.98 | 1.050 | 0.600 | 15.06 |
| 15 mV/s | Reverse | 24.26 | 1.052 | 0.730 | 18.75 |
| | Forward | 23.81 | 1.039 | 0.640 | 15.91 |
| 6 mV/s | Reverse | 22.17 | 1.085 | 0.774 | 18.62 |
| | Forward | 22.07 | 1.087 | 0.758 | 18.18 |

In conclusion, the highly reproducible perovskite solar cell of the present invention can be fabricated from the Lewis base adduct of PbI$_2$. The use of the second solution capable of selectively removing the first solvent can stably maintain the Lewis base ligand coordinating to PbI$_2$ in the structure of the intermediate, ensuring a more stable phase of the lead halide adduct. Thus, the perovskite solar cell of the present invention has an average PCE of ≥18.3% and a best PCE of ≥19.7%.

What is claimed is:

1. An adduct represented by Formula 1:

$$A \cdot PbY_2 \cdot Q \quad (1)$$

wherein A is an organic or inorganic halide, Y is F$^-$, Cl$^-$, Br$^-$ or I$^-$ as a halogen ion, and Q is a Lewis base comprising a functional group containing a nitrogen (N), oxygen (O) or sulfur (S) atom with an unshared pair of electrons as an electron pair donor, the FT-IR peak of the functional group in the compound of Formula 1 being red-shifted by 1 to 10 cm$^{-1}$ relative to that in a compound represented by Formula 2:

$$PbY_2 \cdot Q \quad (2)$$

wherein Y and Q are as defined in Formula 1,
wherein the adduct is obtained by reacting A, PbY$_2$ and Q in a molar ratio of 1:1:1 and the adduct has XRD diffraction peaks at 2θ angles of 7-8.5 and 9.8-10.5.

2. The adduct according to claim 1, wherein the FT-IR peak corresponding to the functional group containing the electron pair donor atom where the Lewis base represented by Q is bonded to Pb is red-shifted by 10 to 30 cm$^{-1}$ relative to that in the compound of Formula 2.

3. The adduct according to claim 1, wherein the adduct has XRD diffraction peaks at 2θ angles of 6-7, 7-8.5, and 9.8-10.5.

4. The adduct according to claim 1, wherein the adduct has XRD diffraction peaks at 2θ angles of 7-8.5, 9.8-10.5, 11-12.5, and 13-14.

5. The adduct according to claim 1, wherein Q is selected from the group consisting of dimethyl sulfoxide (DMSO), N,N-dimethylacetamide (DMA), N-methyl-2-pyrrolidinone (MPLD), N-methyl-2-pyridine (MPD), 2,6-dimethyl-γ-pyrone (DMP), acetamide, urea, thiourea (TU), N,N-dimethylthioacetamide (DMTA), thioacetamide (TAM), ethylenediamine (EN), tetramethylethylenediamine (TMEN), 2,2'-bipyridine (BIPY), 1,10-piperidine, aniline, pyrrolidine, diethylamine, N-methylpyrrolidine, n-propylamine, and combinations thereof.

6. The adduct according to claim 1, wherein Q is a Lewis base comprising at least one functional group selected from the group consisting of thioamide, thiocyanate, thioether, thioketone, thiol, thiophene, thiourea, thioacetamide, and thiosulfate groups, each of which comprises a sulfur (S) atom with an unshared pair of electrons as an electron pair donor.

7. The adduct according to claim 1, wherein Q is a Lewis base comprising at least one functional group selected from the group consisting of thioamide, thiocyanate, thioether, thioketone, thiol, thiophene, thiourea, thiosulfate, thioacetamide, carbonyl, aldehyde, carboxyl, ether, ester, sulfonyl, sulfo, sulfinyl, thiocyanate, pyrrolidone, peroxy, amide, amine, imide, imine, azide, pyridine, pyrrole, nitro, nitroso, cyano, nitroxy, and isocyano groups.

8. The adduct according to claim 1, wherein A is a compound in which an organic cation represented by Formula 3:

$$(R_1R_2N=CH-NR_3R_4)^+ \quad (3)$$

wherein R$_1$, R$_2$, R$_3$, and R$_4$ are independently selected from hydrogen and substituted or unsubstituted C$_1$-C$_6$ alkyl, an organic cation represented by Formula 4:

$$(R_5R_6R_7R_8N)^+ \quad (4)$$

wherein R$_5$, R$_6$, R$_7$, and R$_8$ are independently hydrogen, substituted or unsubstituted C$_1$-C$_{20}$ alkyl or substituted or unsubstituted aryl, or a Cs$^+$ cation is bonded to a halogen ion selected from F$^-$, Cl$^-$, Br$^-$, and I$^-$.

9. The adduct according to claim 1, wherein A is CH$_3$NH$_3$I, CH(NH$_2$)$_2$I or CsI.

* * * * *